US008614034B2

(12) United States Patent
Moon et al.

(10) Patent No.: US 8,614,034 B2
(45) Date of Patent: Dec. 24, 2013

(54) METHOD OF MANUFACTURING PHOTO-MASK

(75) Inventors: Seong-ho Moon, Yongin-si (KR); Artem Shamsuarov, Suwon-si (KR); Seung-hune Yang, Seoul (KR); Seong-bo Shim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 138 days.

(21) Appl. No.: 13/370,496

(22) Filed: Feb. 10, 2012

(65) Prior Publication Data
US 2012/0208111 A1   Aug. 16, 2012

(30) Foreign Application Priority Data

Feb. 15, 2011   (KR) .......................... 10-2011-0013229

(51) Int. Cl.
*G03F 1/36*   (2012.01)
(52) U.S. Cl.
USPC ............................................................ 430/5
(58) Field of Classification Search
USPC ............ 430/5, 311, 322, 323, 394; 716/52–55
See application file for complete search history.

(56) References Cited

U.S. PATENT DOCUMENTS

| 7,707,538 | B2 | 4/2010 | Wong et al. | |
|---|---|---|---|---|
| 2008/0010628 | A1* | 1/2008 | Jung et al. | 716/19 |
| 2010/0167184 | A1 | 7/2010 | Wong et al. | |

FOREIGN PATENT DOCUMENTS

| KR | 10-0896861 B1 | 4/2009 |
|---|---|---|
| KR | 10-2010-0025822 A | 3/2010 |

* cited by examiner

*Primary Examiner* — Stephen Rosasco
(74) *Attorney, Agent, or Firm* — Lee & Morse, P.C.

(57) ABSTRACT

Provided is a method of manufacturing a photo-mask having a micro pattern. The method includes providing an analyzing design layout, dividing the analyzing design layout into a two-dimensionally repeated portion, a one-dimensionally repeated portion, and a non-repeated portion, forming a first corrected layout by performing optical proximity correction (OPC) in the two-dimensionally repeated portion, forming a second corrected layout, taking account of the first corrected layout, by performing OPC in the one-dimensionally repeated portion, forming a third corrected layout, taking account of the first corrected layout and the second corrected layout, by performing OPC in the non-repeated portion, and forming a photo-mask based on the first through third corrected layouts.

20 Claims, 15 Drawing Sheets (a)

(b)

FIG. 4
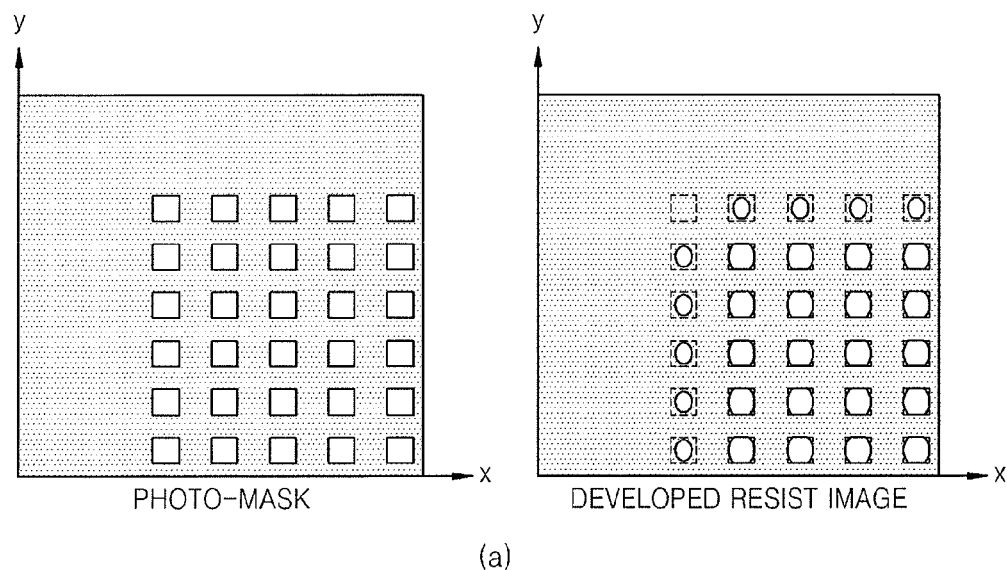
(a)
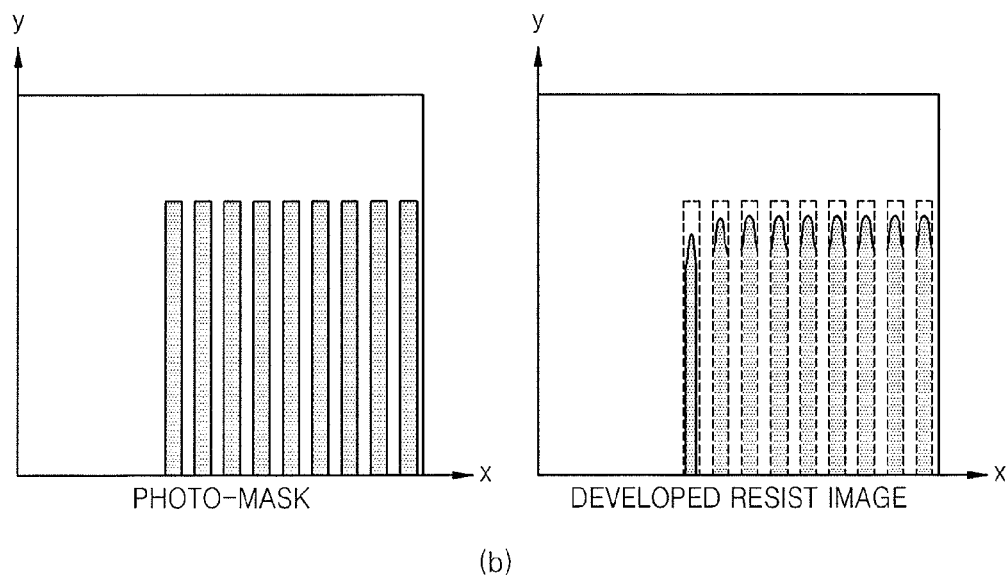
(b)

METHOD OF MANUFACTURING PHOTO-MASK

CROSS-REFERENCE TO RELATED APPLICATIONS

This application claims the benefit of Korean Patent Application No. 10-2011-0013229, filed on Feb. 15, 2011, in the Korean Intellectual Property Office, the disclosure of which is incorporated herein in its entirety by reference.

BACKGROUND

1. Field

The inventive concept relates to a method of manufacturing a photo-mask, and more particularly, to a method of manufacturing a photo-mask by performing optical proximity correction (OPC) for precise formation of a micro pattern.

2. Description of the Related Art

With the development of photo-lithography technology, the scaling down of integrated circuits has been accelerated. In line with this, a size of a pattern transferred onto a wafer is getting smaller than a wavelength of an exposure beam, and thus, optical proximity correction (OPC) for correcting diffraction and interference of light is recognized as indispensable to a more precise and reliable micro pattern.

SUMMARY

The inventive concept provides a method of manufacturing a photo-mask, which uses optical proximity correction (OPC), to manufacture a semiconductor device having a micro pattern.

According to an aspect of the inventive concept, there is provided a method of manufacturing a photo-mask, the method including providing an analyzing design layout, dividing the analyzing design layout into a two-dimensionally repeated portion, a one-dimensionally repeated portion, and a non-repeated portion, forming a first corrected layout by performing optical proximity correction (OPC) in the two-dimensionally repeated portion, forming a second corrected layout by performing OPC in the one-dimensionally repeated portion, while taking into account the first corrected layout, forming a third corrected layout by performing OPC in the non-repeated portion, while taking into account the first corrected layout and the second corrected layout, and forming a photo-mask based on the first through third corrected layouts.

Dividing the analyzing design layout may include performing lithography process simulation with respect to the analyzing design layout to obtain a simulation result, and analyzing sizes and positions of patterns in the simulation result.

Dividing the analyzing design layout may include forming the two-dimensionally repeated portion to include patterns which have size deviations and position deviations of less than predetermined allowable values along two directions perpendicular to each other among the patterns included in the simulation result, forming the one-dimensionally repeated portion to include patterns which have size deviations and position deviations of less than predetermined allowable values along one of the two perpendicular directions among the patterns included in the simulation result, and forming the non-repeated portion to include the remaining patterns of the simulation result except for the two-dimensionally repeated portion and the one-dimensionally repeated portion.

Forming the second corrected layout may include performing OPC on the one-dimensionally repeated portion separately along repeated directions.

Forming the third corrected layout may include performing OPC on the non-repeated portion by dividing the non-repeated portion into a plurality of non-repeated division portions according to a degree of a size deviation and a degree of a position deviation.

Forming the first through third corrected layouts may include performing OPC by using a first OPC method via symmetric size increase/reduction or by using a second OPC method via symmetric/asymmetric size increase/reduction or/and position change, forming of the first corrected layout including performing OPC by using the first OPC method.

If patterns of the one-dimensionally repeated portion and the non-repeated portion have only size deviations, forming the second corrected layout and the third corrected layout may include performing OPC by using the first OPC method.

If there are patterns having position deviations in the one-dimensionally repeated portion and the non-repeated portion, forming the second corrected layout and the third corrected layout may include performing OPC by using the second OPC method.

If there are patterns having only size deviations and patterns having position deviations in the one-dimensionally repeated portion, forming the second corrected layout may include performing OPC on the patterns having only size deviations among the patterns of the one-dimensionally repeated portion by using the first OPC method and performing OPC on the patterns having position deviations among the patterns of the one-dimensionally repeated portion by using the second OPC method, and forming of the third corrected layout may include performing OPC by using the second OPC method.

Providing the analyzing design layout may include providing a layout of a cell region, selecting a partial cell region in a rectangular shape from a corner of the cell region in the layout of the cell region, and forming the analyzing design layout in a rectangular shape having four corners by combining the partial cell region and a result of reversing or rotating the partial cell region.

Forming the photo-mask may include forming a corrected cell region layout, and forming a mask pattern on a blank mask by using the corrected cell region layout, forming the corrected cell region layout may includes forming a cell corner portion layout by disposing the third corrected layout in corner regions of the cell region, forming a cell edge portion layout by repetitively disposing the second corrected layout in an edge region between two adjacent corner regions of the cell region, and forming a cell central portion layout by repetitively disposing the first corrected layout in a central region except for the corner regions and the edge region of the cell region.

Forming the second corrected layout may include performing OPC by considering the first corrected layout as a boundary condition for the second corrected layout.

Forming the third corrected layout may include performing OPC by considering the first corrected layout and the second corrected layout as boundary conditions for the third corrected layout.

According to an aspect of the inventive concept, there is also provided a method of manufacturing a photo-mask, the method including providing a design layout comprising a cell region and a peripheral circuit/core region, performing cell region optical proximity correction (OPC) on the cell region in the design layout, performing peripheral circuit/core region OPC on the peripheral circuit/core region in the design layout, and forming a photo-mask based on a result of the cell region OPC and a result of the peripheral circuit/core region OPC, performing OPC on the cell region OPC may include forming an analyzing design layout based on the cell region of the design layout, dividing the analyzing design layout into a two-dimensionally repeated portion, a one-dimensionally repeated portion, and a non-repeated portion, forming a first corrected layout by performing OPC in the two-dimensionally repeated portion, forming a second corrected layout, taking into account the first corrected layout as a boundary condition, by performing OPC in the one-dimensionally repeated portion, and forming a third corrected layout, taking into account the first corrected layout and the second corrected layout as boundary conditions, by performing OPC in the non-repeated portion, and wherein forming the peripheral circuit/core region OPC may include performing pattern weakness check with respect to the peripheral circuit/core region, and separately performing OPC by dividing the peripheral circuit/core region into sub regions, considering a result of the pattern weakness check.

Performing the pattern weakness check may include analyzing an image log-slope (ILS) with respect to the peripheral circuit/core region of the design layout, and analyzing the pattern weakness based on a result of the ILS.

According to an aspect of the inventive concept, there is also provided a method of manufacturing a photo-mask, the method including providing an analyzing design layout, dividing the analyzing design layout into a two-dimensionally repeated portion, a one-dimensionally repeated portion, and a non-repeated portion, forming a first corrected layout by performing optical proximity correction (OPC) in the two-dimensionally repeated portion, forming a second corrected layout by performing OPC in the one-dimensionally repeated portion, such that the first corrected layout defines a boundary between the two-dimensionally repeated portion and the one-dimensionally repeated portion, forming a third corrected layout by performing OPC in the non-repeated portion, such that the first corrected layout defines a boundary between the two-dimensionally repeated portion and the one-dimensionally repeated portion and the second corrected layout defines a boundary between the one-dimensionally repeated portion and the non-repeated portion, and forming a photo-mask based on the first through third corrected layouts.

Dividing the analyzing design layout may include forming the two-dimensionally repeated portion in a center of the layout, forming the one-dimensionally repeated portion along edges of the layout, and forming the non-repeated portion in corners of the layout.

Dividing the analyzing design layout may include forming the two-dimensionally repeated portion to include patterns along two directions perpendicular to each other, forming the one-dimensionally repeated portion to include patterns along one of the two perpendicular directions, and forming the non-repeated portion to include patterns other than patterns of the two-dimensionally repeated portion and the one-dimensionally repeated portion.

Forming the third corrected layout may include performing OPC on the non-repeated portion by dividing the non-repeated portion into a plurality of non-repeated division portions according to a degree of a size deviation and a degree of a position deviation.

Forming the first through third corrected layouts may include performing OPC by using a first OPC method via symmetric size increase/reduction or by using a second OPC method via symmetric/asymmetric size increase/reduction or/and position change, forming of the first corrected layout including performing OPC by using the first OPC method.

BRIEF DESCRIPTION OF THE DRAWINGS

The above and other features and advantages will become more apparent to those of ordinary skill in the art by describing in detail exemplary embodiments with reference to the attached drawings, in which:

FIGS. 4(a) and 4(b) illustrate conceptual diagrams for describing the concept of performing OPC by dividing a cell region into a plurality of portions to manufacture a photo-mask according to an exemplary embodiment of the inventive concept;

DETAILED DESCRIPTION

Figure 1:
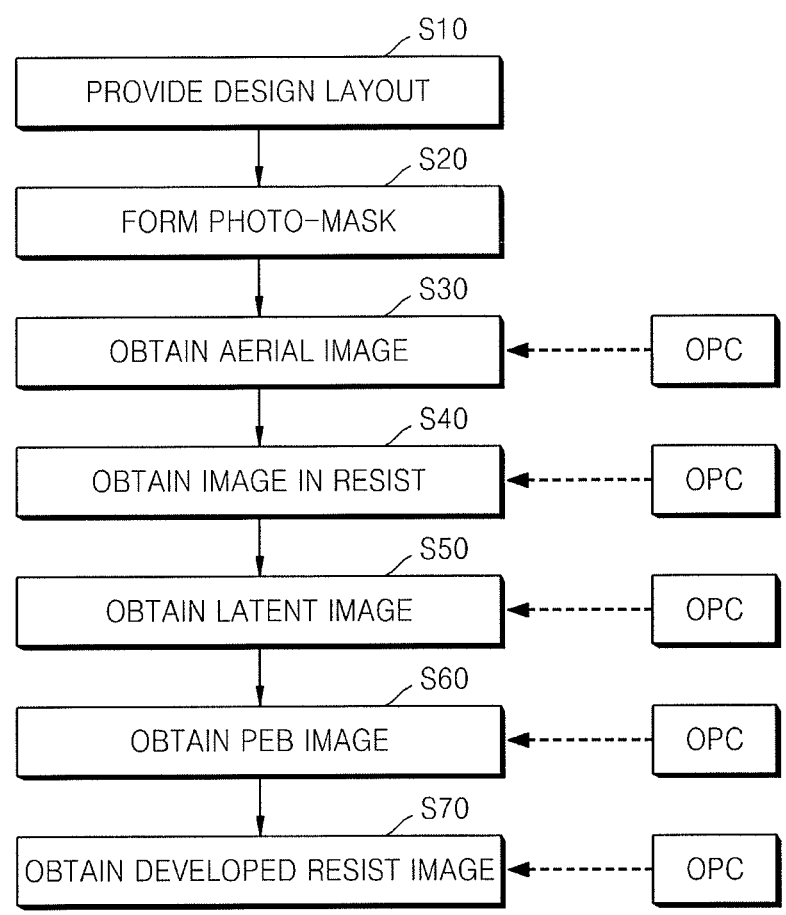
FIGS. 1 through 3 illustrate a flowchart and conceptual diagrams for describing optical proximity correction (OPC) using lithography process simulation to manufacture a photo-mask according to an exemplary embodiment of the inventive concept.

Hereinafter, an exemplary embodiment of the inventive concept will be described with reference to the accompanying drawings.

The exemplary embodiment of the inventive concept is provided to more fully describe the inventive concept to those of ordinary skill in the art. The following exemplary embodiment may be modified to various types and the scope of the inventive concept is not limited to the following embodiments; rather, these embodiments are provided so that this disclosure will be thorough and complete, and will fully convey the spirit of the inventive concept to those skilled in the art.

In the drawings, the dimensions of elements and regions may be for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The terms used herein are for illustrative purposes of the inventive concept only and should not be construed to limit the meaning or the scope of the inventive concept. As used in this specification, a singular form may, unless definitely indicating a particular case in terms of the context, include a plural form. Also, the expressions "comprise" and/or "comprising" used in this specification neither define the mentioned shapes, numbers, steps, operations, members, elements, and/or groups of these, nor exclude the presence or addition of one or more other different shapes, numbers, steps, operations, members, elements, and/or groups of these, or addition of these.

As used herein, terms such as "first," "second," etc. are used to describe various members, components, regions, layers and/or portions. However, it is obvious that the members, components, regions, layers and/or portions should not be defined by these terms. The terms do not mean a particular order, up and down, or superiority, and are used only for distinguishing one member, component, region, layer, or portion from another member, component, region, layer, or portion. Thus, a first member, component, region, layer, or portion which will be described may also refer to a second member, component, region, layer, or portion, without departing from the scope of the inventive concept.

Figure 2:
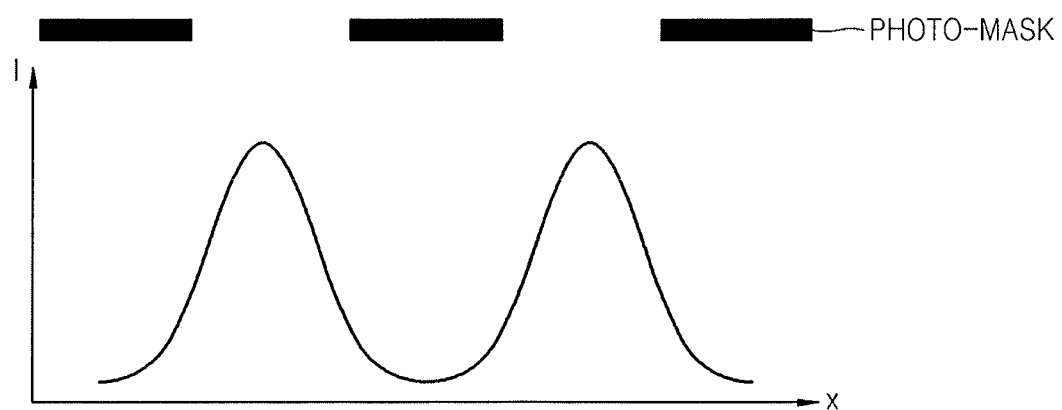
Figure 3:
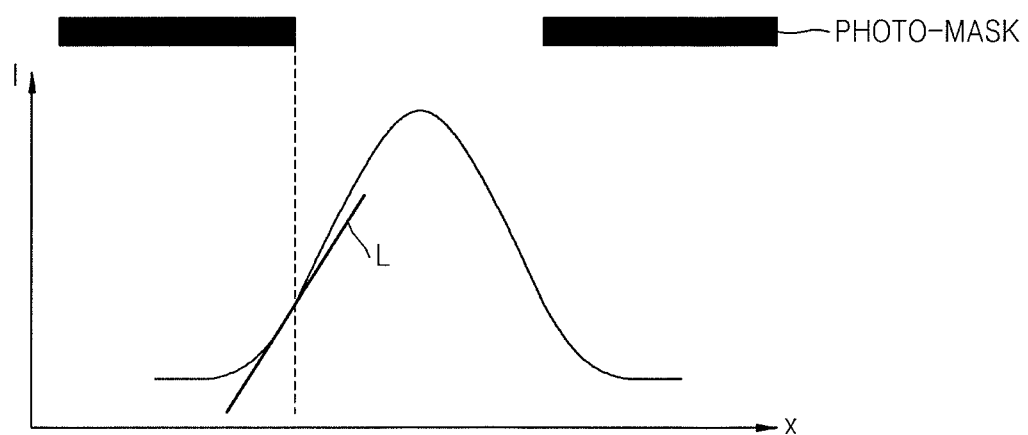

FIGS. 1 through 3 are a flowchart and conceptual diagrams for describing optical proximity correction (OPC) using lithography process simulation to manufacture a photo-mask according to an exemplary embodiment of the inventive concept.

FIG. 1 is a flowchart of a lithography process simulation for describing a process of performing OPC to manufacture a photo-mask according to an exemplary embodiment of the inventive concept. FIG. 2 is a conceptual diagram of an aerial image applied to a lithography process simulation performed to manufacture a photo-mask according to an exemplary embodiment of the inventive concept. FIG. 3 is a conceptual diagram of an image log-slope (ILS) applied to a lithography process simulation performed to manufacture a photo-mask according to an exemplary embodiment of the inventive concept.

Referring to FIG. 1, lithography process simulation for manufacturing a semiconductor device may include obtaining a photo-mask in operation S20 by using a design layout provided in operation S10, obtaining an aerial image with light passing through the photo-mask in operation S30, obtaining an image in resist in operation S40, obtaining a latent image in resist through exposure in operation S50, obtaining a latent image through post-exposure bake (PEB) in operation S60, and obtaining a developed resist image in operation S70.

OPC may be performed on at least one of the aerial image obtained in operation S30, the image in resist obtained in operation S40, the latent image obtained in operation S50, the latent image obtained in operation S60, and the developed resist image obtained in operation S70. In other words, OPC may be performed on one image or two or more images selected from among the listed images or on all of the listed images. Alternatively, a pattern weakness check may be performed in the provided design layout, and then OPC may be performed separately on different images according to pattern weakness. The respective images will be described in more detail later.

The design layout may be used to perform lithography process simulation for performing OPC before a photo-mask is actually manufactured. The photo-mask is a mask applied to manufacturing of various micro semiconductor devices. Examples of the micro semiconductor devices may include, but not limited to, high-integration circuit semiconductor memory devices, e.g., dynamic random access memory (DRAM), static random access memory (SRAM), flash memory devices, etc., processors, e.g., a central processing unit (CPU), a digital signal processor (DSP), a combination of a CPU and a DSP, etc., application specific integrated circuits (ASICs), micro electro mechanical system (MEMS) devices, optoelectronic devices, display devices, and so forth.

The design layout may include a cell region layout for a cell region portion of a semiconductor device and a peripheral circuit/core region layout for a peripheral circuit/core region portion of the semiconductor device. When the semiconductor device is a memory device, the cell region portion means a portion where a memory cell is disposed and the peripheral circuit/core region portion means a portion other than the portion where a memory cell is disposed, such as a portion where a sense amplifier, a decoder, an encoder, or the like is disposed to store data in, read data from, or keep data in the memory cell. When the semiconductor device is a non-memory device, the cell region portion means a portion where a memory cell, such as a cash memory, a buffer, or the like, is disposed and the peripheral circuit/core region portion means a portion of the non-memory device, other than the portion where a memory cell is disposed. When the semiconductor device is an optoelectronic device or a display device, the cell region portion means a portion where individual devices for receiving or emitting light are disposed in the form of a matrix and the peripheral circuit/core region portion means a portion other than the cell region portion. The design layout may form a pattern, e.g., to be formed with simple polygonal shapes, in operation S10.

The photo-mask may be formed from information contained in the design layout in operation S20. Herein, the photo-mask may be a photo-mask image formed by simulation, rather than an actually manufactured photo-mask. Ideally, the photo-mask may completely convey the information of the design layout. However, the actual photo-mask may not completely convey the information of the design layout due to transmittance distribution. On the assumption that the information of the design layout is completely conveyed, the process of obtaining the photo-mask in operation S20 may be skipped in lithography simulation, such that the aerial image may be formed directly from the design layout in operation S30.

From the design layout provided in operation S10 or the simulated photo-mask image obtained in operation S20, an image projected using a projection imaging tool, for example, a scanner, a stepper, or a step-and-scan tool, may be farmed through simulation in operation S30. The projected image will be referred to as the aerial image.

Referring to FIGS. 1 and 2, the aerial image is a distribution of light intensity expressed with a function of a spatial position in or within or near an image plane. That is, the aerial image projected through the photo-mask (or the design layout) may have image contrast. Thus, through lithography process simulation, the aerial image may be obtained from the provided design layout or the photo-mask image in operation S30.

Referring to FIGS. 1 through 3, from the aerial image, a slope of image intensity I, which is a function of position x, may be measured. That is, a slope of image intensity I at a particular position may be measured as a slope of a tangent line L. A position corresponding to a larger slope of image intensity I may have better image quality than a position corresponding to a smaller slope of image intensity I.

However, change in irradiation amount leads to change in a slope of image intensity I. Hence, to determine image quality from a slope of image intensity, a normalized slope of image intensity, i.e., image log-slope (ILS), may be used according to Equation 1 below, where I indicates image intensity and x indicates a position.

$$ILS = \frac{1}{I} \cdot \frac{dI}{dx} = \frac{d\ln(I)}{dx} \qquad \text{Equation 1}$$

By analyzing image quality, the weakness of a pattern formed to manufacture a semiconductor device may be checked. Thus, by analyzing ILS, the pattern weakness check may be performed.

The aerial image means an image formed in space. As a result, an image formed in resist on a semiconductor substrate may be different from the aerial image. For example, according to reflection/refraction at an interface between the air and the resist and reflection from the semiconductor substrate, an image different from the aerial image may be formed in resist. In other words, the image in resist may be obtained by simulation, taking into account incident angle and polarization in operation S40.

The image in resist may be different from a resist exposure result. This is because of the degree of delivery of energy supplied by the image in resist, i.e., the sensitivity of resist should be considered. Thus, the latent image in resist through exposure may be formed by simulation considering the sensitivity of the resist in operation S50. The latent image is fanned by a portion where resist is exposed and a portion where resist is not exposed.

Once PEB is performed, the latent image may be changed. In particular, according to a type of resist, different latent images may be formed after PEB. The PEB image may be obtained from simulation considering a chemical action of resist during PEB, e.g., reaction, diffusion, or the like. If a quencher is used, the action of the quencher may also be considered in operation S60.

After development is performed, an image different from the PEB image may be formed due to variation in the solubility of the resist. Thus, the developed resist image may be obtained by simulation considering a variation in solubility of the resist in operation S70.

In this way, from operation S30 of obtaining the aerial image (or operation S20 of obtaining the photo-mask image) to operation S70 of obtaining the developed resist image, lithography process simulation may be performed, taking into account a physical phenomenon or a chemical phenomenon in a corresponding operation. The lithography process simulation, when considering an actually occurring physical phenomenon or chemical phenomenon, may be referred to as physical photo-lithography simulation.

By performing the physical photo-lithography simulation and performing OPC based on the physical photo-lithography simulation, OPC considering all effects, e.g., pattern shift, three-dimensional (3D) mask effect, wafer topology effect, development effect, and so forth, may be possible.

To perform simulation for obtaining an image in a subsequent operation in lithography process simulation, simulation for obtaining an image in a previous operation has to be performed. For example, after the aerial image is obtained first through simulation in operation S30, the image in resist may be obtained through simulation reflecting physical characteristics of the air-resist-semiconductor substrate in operation S40. Alternatively, after the image in resist is obtained through simulation in operation S40, the latent image may be obtained through simulation reflecting the sensitivity of resist in operation S50. Alternatively, after the latent image is obtained through simulation in operation S50, the PEB image may be obtained through simulation reflecting a chemical action of resist in operation S60. Alternatively, after the PEB image is obtained through simulation in operation S60, the developed resist image may be obtained through simulation reflecting a variation in solubility of resist in operation S70. Such a series of operations may be consecutively performed by lithography process simulation. However, a simulation time required for obtaining the developed resist image in operation S70 may be longer than a simulation time required for obtaining the aerial image in operation S30.

OPC may be selectively performed after at least one of the aerial image in operation S30, the image in resist in operation S40, the latent image in operation S50, the latent image in operation S60, and the developed resist image in operation S70 is obtained through simulation. However, when a simulation time required for obtaining the aerial image in operation S30 is longer than a simulation time required for obtaining the developed resist image in operation S70, OPC performed based on the developed resist image may consume more time than OPC performed based on the aerial image. Nevertheless, OPC performed based on an image obtained in a subsequent operation may provide a more accurate result.

Therefore, after a pattern weakness check is performed based on the foregoing ILS analysis result, a cell region may be divided into sub regions according to pattern weakness and for a sub region having relatively high-weakness patterns OPC may be performed based on an image obtained in a subsequent operation. For example, for a region including a sub region having relatively low-weakness patterns, OPC is performed based on the aerial image; whereas for a region including a sub region having relatively high-weakness patterns, OPC may be performed based on an image obtained in a subsequent image, i.e., the image in resist, the latent image, the PEB image, or the developed resist image.

FIGS. 4(a) and 4(a) are conceptual diagrams for describing the concept of performing OPC by dividing a cell region into a plurality of portions to manufacture a photo-mask according to an exemplary embodiment of the inventive concept.

Referring to FIGS. 4(a) and 4(b), the shape of a photo-mask for forming hole patterns and the shape of a developed resist image formed through the photo-mask are shown in FIG. 4(a), and the shape of a photo-mask for forming line patterns and the shape of a developed resist image formed through the photo-mask are shown in FIG. 4 (b). The shapes of the photo-masks for forming the hole patterns and the line patterns are those before OPC is performed, and may be the shapes on a design layout.

As can be seen in FIGS. 4(a) and 4(b), both the hole patterns and the line patterns in the developed resist images are deformed at the edge portions. A central portion where deformation does not occur is repeated two-dimensionally (in x and y directions). The edge portions, i.e., portions along a boundary except for a corner portion, are repeated one-dimensionally (in the x or y direction). On the other hand, the corner portion has no repetition.

Figure 5:
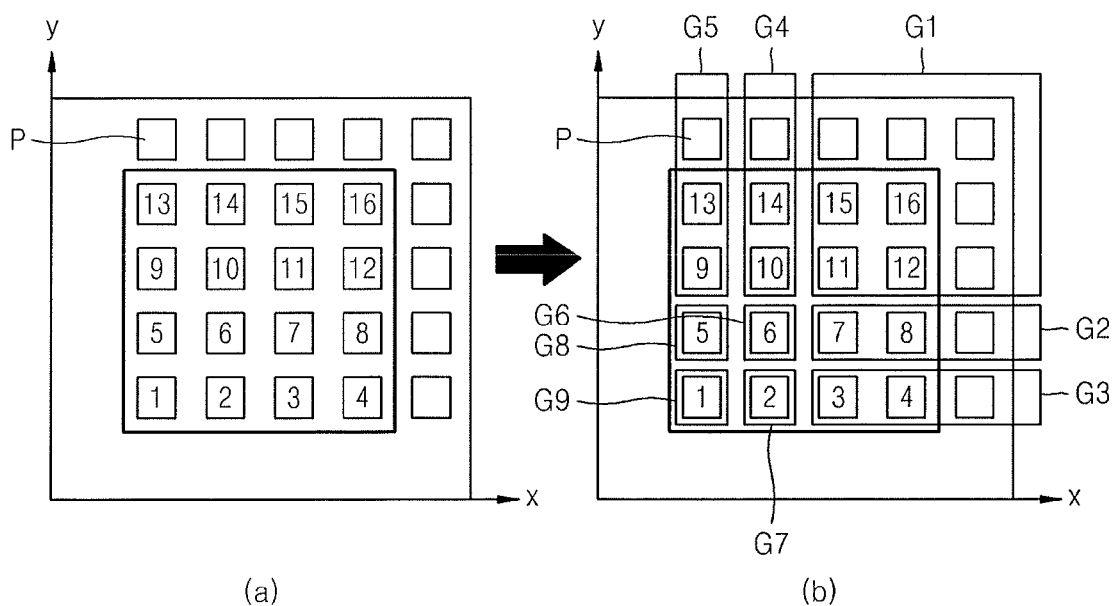
FIGS. 5(a) and 5(b) illustrate conceptual diagrams for describing a method of dividing a cell region into a plurality of portions for OPC to manufacture a photo-mask according to an exemplary embodiment of the inventive concept.

FIGS. 5(a) and 5(b) are conceptual diagrams for describing a method of dividing a cell region into a plurality of portions for OPC to manufacture a photo-mask according to an exemplary embodiment of the inventive concept.

Referring to FIGS. 5(a) and 5(b), patterns P may be selected in a corner portion of a cell region as shown in FIG. 5(a), followed by measuring critical dimensions (CDs) to classify the patterns P into a plurality of groups, e.g., groups G1 through G9. For example, sixteen (16) patterns 1 through 16 may be selected from among the patterns P in the corner portion of the cell region as shown in FIG. 5(a) for CD measurement.

A two-dimensionally repeated portion among the sixteen (16) patterns 1 through 16 may be classified as a first group G1. The two-dimensionally repeated portion includes the patterns 11, 12, 15, and 16 which have size and position deviations of less than predetermined allowable values along two perpendicular directions (x direction and y direction). The size deviations between patterns mean size deviations of neighboring patterns from a size of a reference pattern, and the position deviations between patterns mean position deviations of neighboring patterns from a position of each reference pattern.

A one-dimensionally repeated portion among the sixteen (16) patterns 1 through 16 may be classified as groups G2 through G5. The one-dimensionally repeated portion includes patterns which have size and position deviations of less than predetermined allowable values along one of the two perpendicular directions (x direction or y direction). For example, patterns 7 and 8 in the second group G2 may have size and position deviations of less than predetermined allowable values along the x direction. In another example, patterns 3 and 4 in the third group G3 may have size and position deviations of less than predetermined allowable values along the x direction. However, the patterns in the second group G2 and the patterns in the third group G3 may have size deviations or position deviations exceeding the predetermined allowable values along the y direction, e.g., between pattern within the second group G2 and pattern within the third group G3. Likewise, the fourth group G4 and the fifth group G5 including patterns 10 and 14 and patterns 9 and 13, respectively, may have pattern size and position deviations of less than predetermined allowable values along the y direction. It is noted that although the patterns P have been classified to include the two groups G2 and G3 along the x direction, the patterns P may also be classified as one group or three and more groups along the x direction.

When OPC is actually performed, a plurality of groups classified along one direction (x direction or y direction) may be regarded as a single portion. In other words, e.g., the second group G2 and the third group G3 may be regarded as a single portion and a pattern (e.g., the pattern 3) of the second group G2 and a pattern (e.g., the pattern 7) of the third group G3 may be regarded as a single pattern for OPC.

A non-repeating portion among the sixteen (16) patterns 1 through 16 may be classified as groups G6 through G9. That is, patterns 1, 2, 5, and 6 among the patterns 1 through 16 have no repetition, so they are classified as separate groups G6, G7, G8, and G9, respectively.

Therefore, in order to perform OPC, the patterns P may be classified into a plurality of groups. The plurality of groups may be then classified into the two-dimensionally repeated portion, the one-dimensionally repeated portion, and the non-repeated portion according to repetition.

Figure 6:
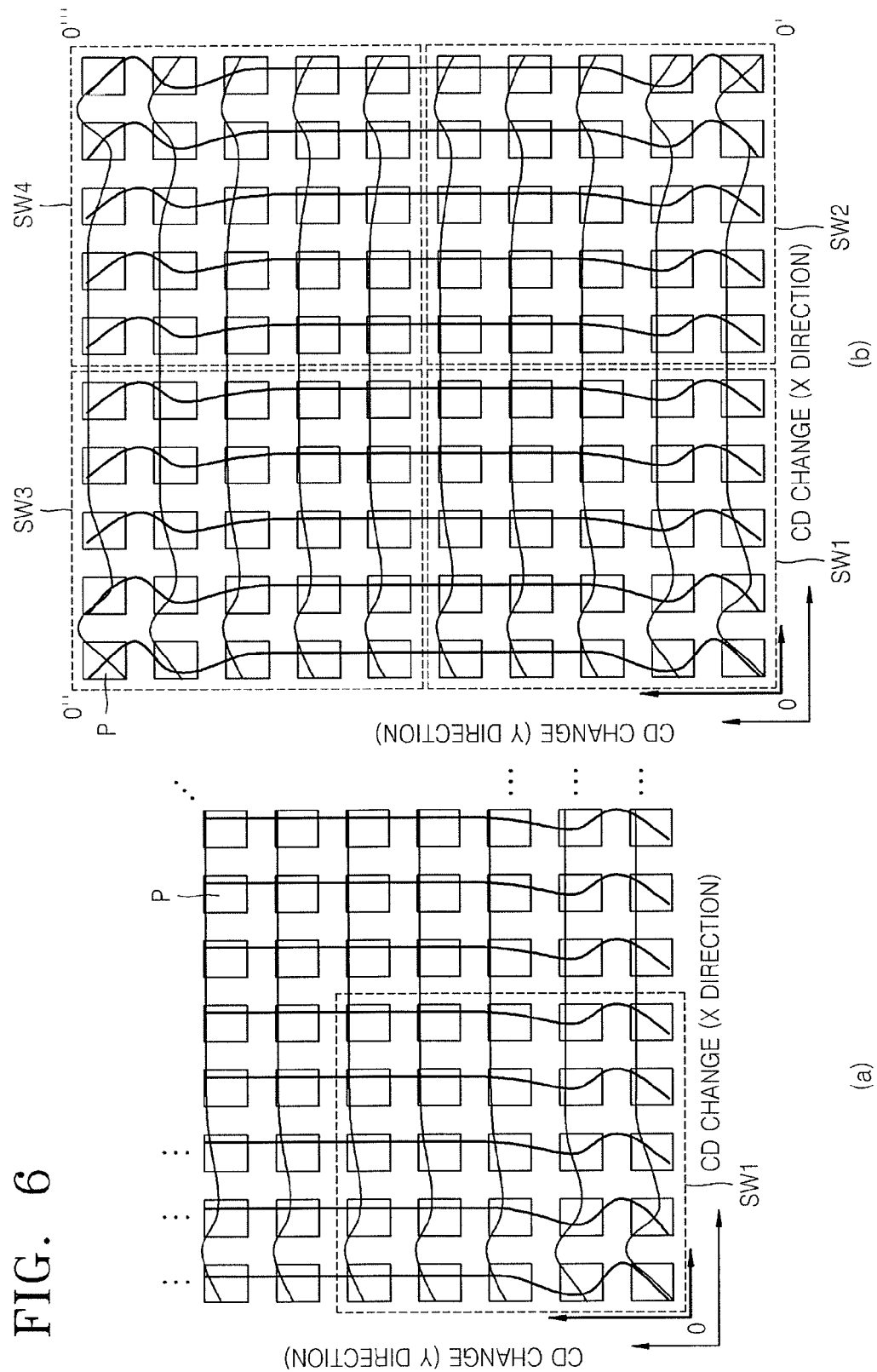
FIGS. 6(a) and 6(b) illustrate conceptual diagrams for describing a process of providing an analyzing design layout for performing lithography process simulation and OPC based on the same to manufacture a photo-mask according to an exemplary embodiment of the inventive concept.

FIGS. 6A and 6B are conceptual diagrams for describing a process of providing an analyzing design layout for performing lithography process simulation and OPC based on the same to manufacture a photo-mask according to an exemplary embodiment of the inventive concept.

Referring to FIGS. 6(a) and 6(b), it can be seen that a large CD change of a pattern P occurs in a portion adjacent to a corner 0 of a cell region. However, as shown in FIG. 6A, a CD change becomes constant in a portion spaced apart by a predetermined distance or more from the corner 0. Considering this aspect, a partial cell region in a rectangular shape, which occupies a predetermined region of the cell region from the corner 0, may be set as a first sample window SW1. The first sample window SW1 may be set to include some portion of a region corresponding to a constant CD change from the corner 0. Each side (x direction or y direction) of the first sample window SW1 may be set to have a length larger than or equal to 5λ/NA. Herein, λ represents a wavelength of a light source of a used projection imaging tool, and NA represents a numerical aperture of the projection imaging tool.

Thereafter, referring to FIG. 6(b), a second sample window SW2 may be formed by rotating the first sample window SW1 with respect to the y axis, and a third sample window SW3 may be formed by rotating the first sample window SW1 with respect to the x axis. A fourth sample window SW4 may be formed by rotating the first sample window SW1 180 degrees or rotating the first sample window SW1 with respect to both the x axis and the y axis. That is, the first sample window SW1 and the second sample window SW2 are mirror images with respect to the y axis, and the first sample window SW1 and the third sample window SW3 are mirror images with respect to the x axis. By combining the first sample window SW1 through the fourth sample window SW4, an analyzing design layout in which corners 0, 0', 0", and 0'" of the first sample window SW1 through the fourth sample window SW4 form four corners of a rectangular shape may be formed as shown in FIG. 6(b). The analyzing design layout shown in FIG. 6B may be in a rectangular shape. The rectangular analyzing design layout may be formed such that each side may have a length equal to or smaller than 10λ/NA.

The foregoing lithography process simulation may be performed by using the analyzing design layout shown in FIG. 6(b). The lithography process simulation result with respect to the analyzing design layout may represent a simulation result with respect to a layout of the entire cell region. That is, the simulation result with respect to the layout of the entire cell region may be generated by reversing the lithography process simulation result with respect to the analyzing design layout.

Figure 7:
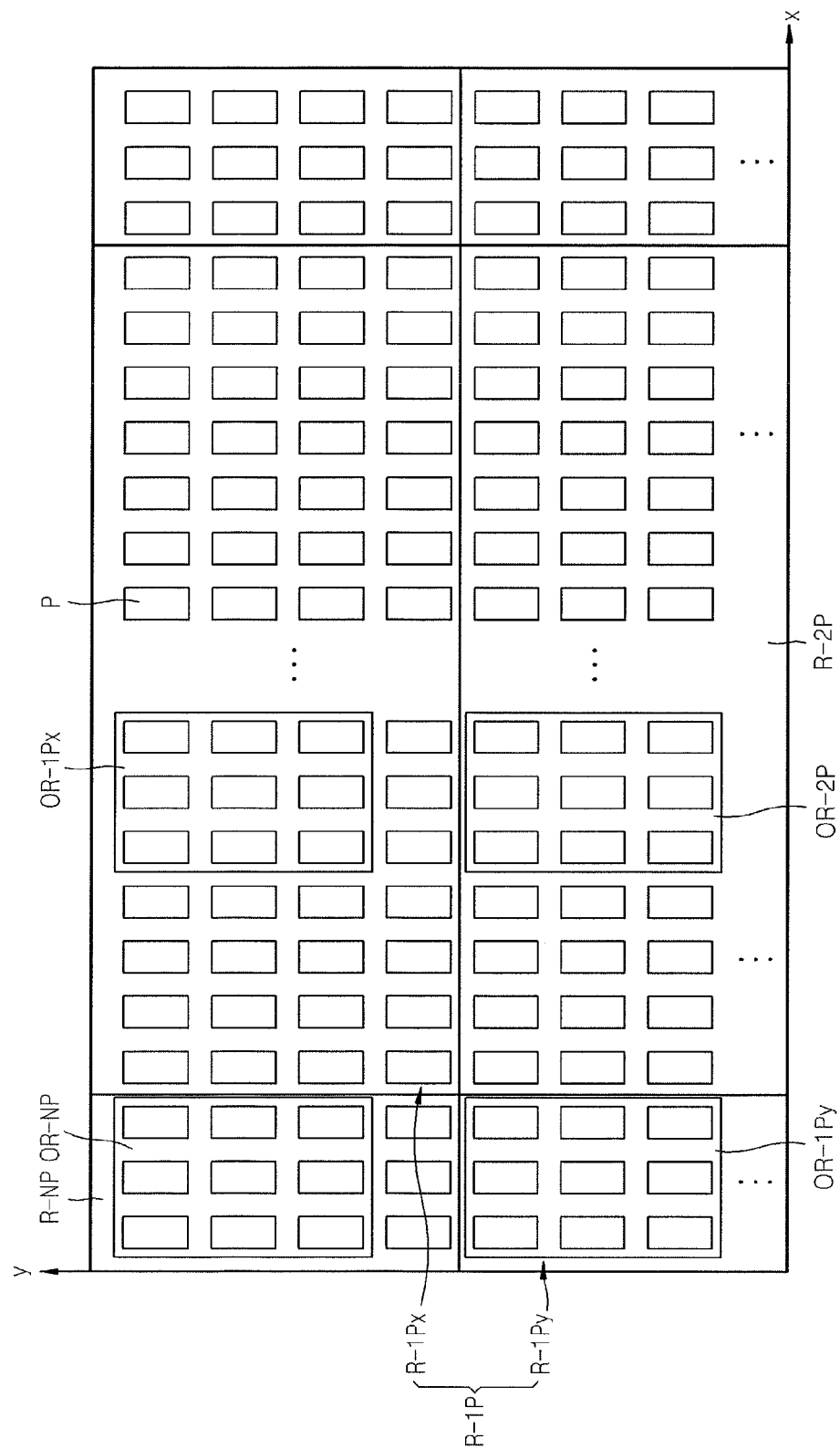
FIG. 7 illustrates a conceptual diagram for describing a method of performing OPC to manufacture a photo-mask according to an exemplary embodiment of the inventive concept.

FIG. 7 is a conceptual diagram for describing a method of performing OPC to manufacture a photo-mask according to an exemplary embodiment of the inventive concept.

Referring to FIG. 7, the lithography process simulation may be performed using the analyzing design layout shown in FIG. 6(b), and then size and position deviations of patterns P may be analyzed based on the lithography process simulation result. Through this analyzing process, the cell region may be classified into a two-dimensionally repeated portion R-2P, a one-dimensionally repeated portion R-1P, and a non-repeated portion R-NP. As mentioned previously, the two-dimensionally repeated portion R-2P includes patterns which have size and position deviations of less than predetermined allowable values along two perpendicular directions, and the one-dimensionally repeated portion R-1P includes patterns which have size and position deviations of less than predetermined allowable values along one of the two perpendicular directions. The non-repeated portion R-NP includes the remaining patterns other than those of the two-dimensionally repeated portion R-2P and the one-dimensionally repeated portion R-1P. The patterns of the non-repeated portion R-NP have to repetition. Although classification into the two-dimensionally repeated portion R-2P, the one-dimensionally repeated portion R-1P, and the non-repeated portion R-NP has been made in the layout of the cell region in FIG. 7, such classification may also be applied to the analyzing design layout shown in FIG. 6(b).

The one-dimensionally repeated portion R-1P may include an x-direction repeated portion R-1Px and a y-direction repeated portion R-1Py. The x-direction repeated portion R-1Px is a portion repeated in the x direction in the one-dimensionally repeated portion R-1P, and the y-direction repeated portion R-1Py is a portion repeated in the y direction in the one-dimensionally repeated portion R-1P.

Herein, the predetermined allowable values may be determined based on a processing margin. That is, they may be determined by taking into account a processing margin of photo-lithography using an actual photo-mask and a processing margin of subsequent etching.

OPC may be performed on two-dimensionally repeated patterns OR-2P for OPC, which are some of patterns included in the two-dimensionally repeated portion R-2P. As a result of OPC with respect to the two-dimensionally repeated patterns OR-2P for OPC, a first corrected layout may be formed. Since the patterns included in the two-dimensionally repeated portion R-2P have repetition, OPC is performed on the two-dimensionally repeated patterns OR-2P for OPC and a result of the OPC, the first corrected layout may be applied to the entire two-dimensionally repeated portion R-2P.

After the first corrected layout is formed by performing OPC with respect to the two-dimensionally repeated portion R-2P, OPC is performed with respect to the one-dimensionally repeated portion R-1P. OPC may be performed on one-dimensionally repeated patterns OR-1Px and OR-1Py for OPC, which are some of the patterns included in the one-dimensionally repeated portion R-1P. The one-dimensionally repeated patterns OR-1Px and OR-1Py for OPC may be determined by selecting patterns disposed from an edge to a portion contacting the two-dimensionally repeated portion R-2P in the one-dimensionally repeated portion R-1P. In this case, the one-dimensionally repeated patterns OR-1Px and OR-1Py for OPC may include at least all of repeated patterns of the one-dimensionally repeated portion R-1P.

OPC with respect to the one-dimensionally repeated patterns OR-1Px and OR-1Py may be performed considering a result of OPC with respect to the two-dimensionally repeated portion R-2P, i.e., the first corrected layout, as a boundary condition. In other words, by considering the first corrected layout, which is a result of OPC with respect to the two-dimensionally repeated portion R-2P, in a portion of the one-dimensionally repeated patterns OR-1Px and OR-1Py contacting the two-dimensionally repeated portion R-2P, as a boundary condition, OPC may be performed on the one-dimensionally repeated patterns OR-1Px and OR-1Py for OPC. In this way, by using the first corrected layout to which OPC has already been applied, as a boundary condition, OPC with respect to the one-dimensionally repeated patterns OR-1Px and OR-1Py can be performed at high speed. As a result of performing OPC with respect to the one-dimensionally repeated patterns OR-1Px and OR-1Py, second corrected layouts may be formed.

The one-dimensionally repeated patterns OR-1Px and OR-1Py may include the x-direction repeated pattern OR-1Px for OPC and the y-direction repeated pattern OR-1Py for OPC. Thus, OPC may be performed separately on the x-direction repeated pattern OR-1Px and the y-direction repeated pattern OR-1Py. In other words, OPC with respect to the one-dimensionally repeated portion R-1P may be performed separately according to repeated directions in the one-dimensionally repeated portion R-1P, for example, separately with respect to the x-direction repeated pattern OR-1Px repeated along the x direction and the y-direction repeated pattern OR-1Py repeated along the y direction.

Since the patterns included in the one-dimensionally repeated portion R-1P have repetition, OPC is performed on the one-dimensionally repeated patterns OR-1Px and OR-1Py and then a result thereof may be applied to the entire one-dimensionally repeated portion R-1P.

Afterwards, OPC may be performed on the non-repeated portion R-NP. For the non-repeated portion R-NP, OPC may be performed with respect to non-repeated patterns OR-NP for OPC which form the entire non-repeated portion R-NP or a portion adjacent to any one of corners. OPC with respect to the non-repeated portion R-NP or the non-repeated patterns OR-NP for OPC may be performed considering the first corrected layout and the second corrected layouts as boundary conditions. In this way, by using the first corrected layout and the second corrected layouts to which OPC has already been applied, as boundary conditions, OPC with respect to the non-repeated portion R-NP or the non-repeated pattern OR-NP for OPC may be performed at high speed. A result of OPC with respect to the non-repeated patterns OR-NP is applied to the entire non-repeated portion R-NP or a result of OPC with respect to the entire non-repeated portion R-NP is used, thereby forming a third corrected layout.

Figure 8:
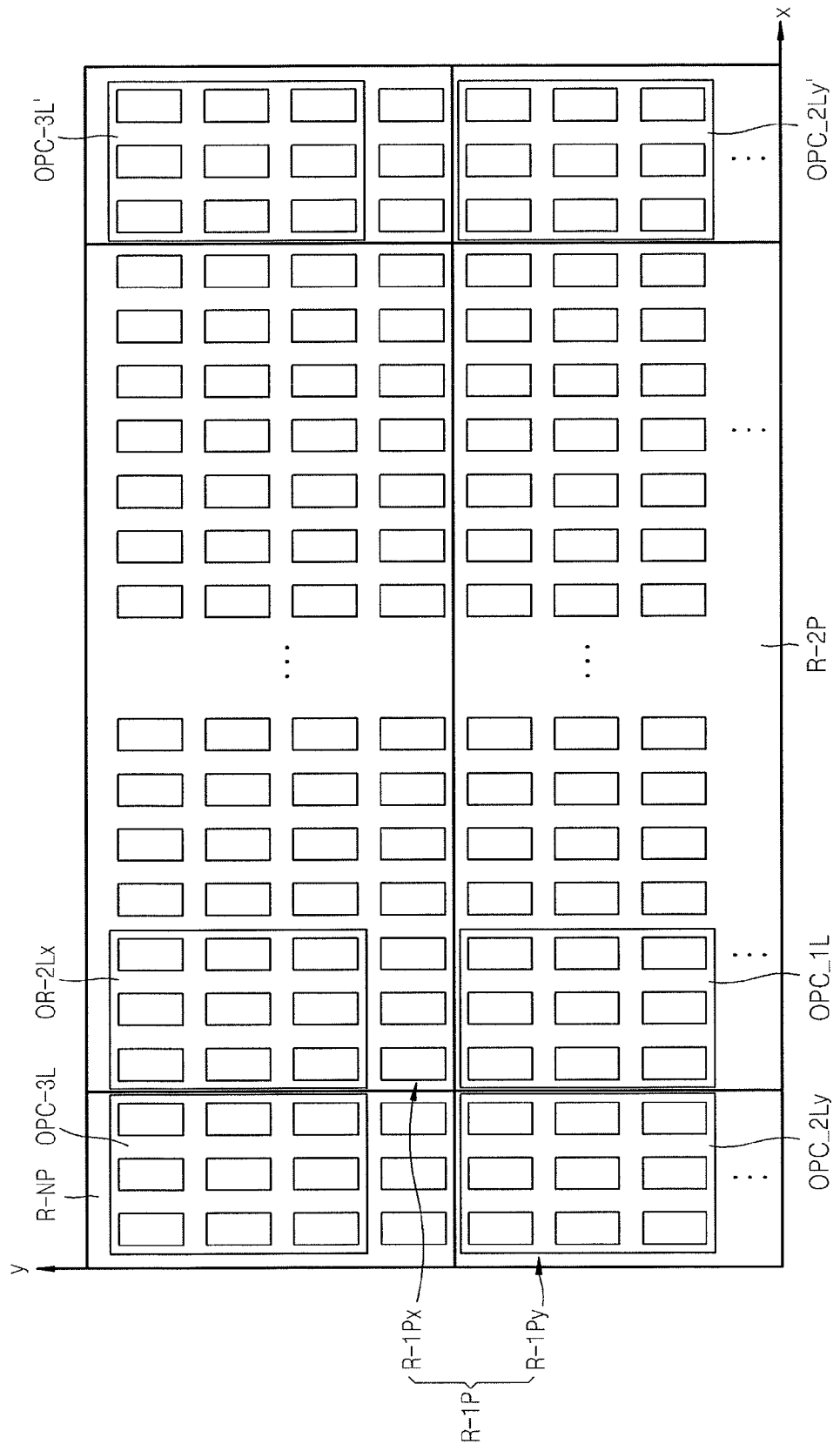
FIG. 8 illustrates a conceptual diagram for describing a process of forming a correction cell region layout to manufacture a photo-mask according to an exemplary embodiment of the inventive concept.

FIG. 8 is a conceptual diagram for describing a process of forming a correction cell region layout to manufacture a photo-mask according to an exemplary embodiment of the inventive concept.

Referring to FIG. 8, a third corrected layout OPC-3L, which is a result of OPC with respect to the non-repeated portion R-NP, may be disposed in a predetermined portion of a corner region of a cell region, i.e., in the non-repeated portion R-NP. An additional third corrected layout OPC-3L' is disposed in another portion of the corner region of the cell region, the non-repeated portion R-NP. In this way, a result of OPC is disposed in any corner region of the cell region, i.e., a portion corresponding to the non-repeated portion R-NP, thereby forming a cell corner portion layout. The additional third corrected layout OPC-3L' may be a mirror image or a rotated image of the third corrected layout OPC-3L.

The second corrected layouts OPC-2Lx and OPC-2Ly, which is a result of OPC with respect to the one-dimensionally repeated portion R-1P, are repetitively disposed in, e.g., along, an edge region between two adjacent corner regions of the cell region, i.e., in the one-dimensionally repeated portion R-1P, thereby forming a cell edge portion layout.

Thereafter, the first corrected layout OPC-1L is repetitively disposed in a central region of the cell region other than the corner regions and the edge regions, that is, the two-dimensionally repeated portion R-2P, thereby forming a cell central portion layout.

As such, a corrected cell region layout including the cell corner portion layout, the cell edge portion layout, and the cell central portion layout may be completed.

Figure 9:
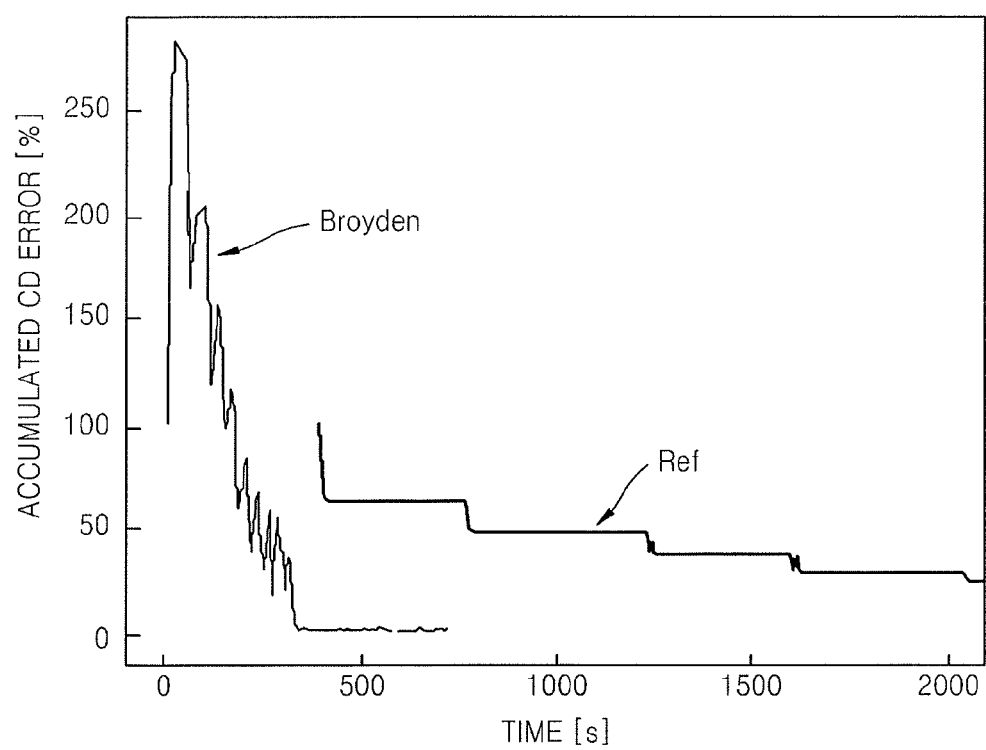
FIG. 9 illustrates a graph showing application of an algorithm for performing OPC to manufacture a photo-mask according to an exemplary embodiment of the inventive concept.

FIG. 9 is a graph showing application of an algorithm for performing OPC to manufacture a photo-mask according to an exemplary embodiment of the inventive concept. In detail, the graph in FIG. 9 compares a process (Broyden) of performing OPC to form the foregoing first through third corrected layouts to a comparative example Ref.

In order to perform OPC to form the first through third corrected layouts, a Broyden's method using a Jacobian matrix may be used. The Broyden's method may be performed using Equations (2) and (3) below.

$$\text{Cost function}(x) = F(x) = \begin{pmatrix} SignalError_1(x) \\ \vdots \\ SignalError_N(x) \end{pmatrix} \quad \text{Equation 2}$$

Equation (2) defines the Cost function $F(x)$. That is, the Cost function may be a matrix composed of SignalError functions indicating size deviations or position deviations with respect to a plurality of (N) patterns. Herein, the patterns may be polygons forming a design layout. In other words, x may represent a size or a position and may be a vector.

$$J_n = J_{n-1} + \frac{1}{\|\Delta x_n\|^2}(\Delta F_n - J_{n-1}\Delta x_n)\Delta x_n^T \quad \text{Equation 3}$$

The Broyden's method using the Jacobian matrix may be executed using Equation (3), where n is an integer between 2 and N. J represents Jacobian and T represents a matrix transpose. Herein, it may be defined that $\Delta x_n = x_n - x_{n-1}$ and $\Delta F_n = F(x_n) - F(x_{n-1})$. Thus, OPC may be performed by sequentially updating the Jacobian matrix.

On the other hand, in the comparison example Ref, OPC is performed using a gradient method, which may be executed using Equations (4) through (6) below.

$$SignalError_i(x) = Signal_i(x) - Threshold \quad \text{Equation 4}$$

In other words, as shown in Equation (4), a difference between a signal corresponding to a size or position (x) with respect to a particular pattern (i) and a predetermined allowable value is defined as a signal error (SignalError). In this case, the Cost function $F(x)$ may be defined in Equation (5) below.

$$\text{Cost function}(x) = F(x) = \sum_{i \in targets} SignalError_i^2(x) \quad \text{Equation 5}$$

If a relationship is applicable, $G(x)$ may be defined in Equation 6 below, where is a constant value.

$$G(x) = \begin{pmatrix} \partial F(x)/\partial x_1 \\ \vdots \\ \partial F(x)/\partial x_N \end{pmatrix} \quad \text{Equation 6}$$

Thus, the gradient method has to perform more iterations in a numerical analysis for OPC. In other words, an embodiment of the inventive concept using the Broyden's method may quickly provide an accurate result in spite of a large accumulated CD error at an initial stage, whereas the comparative example using the gradient method requires more time in spite of a small accumulated CD error.

Figure 10:
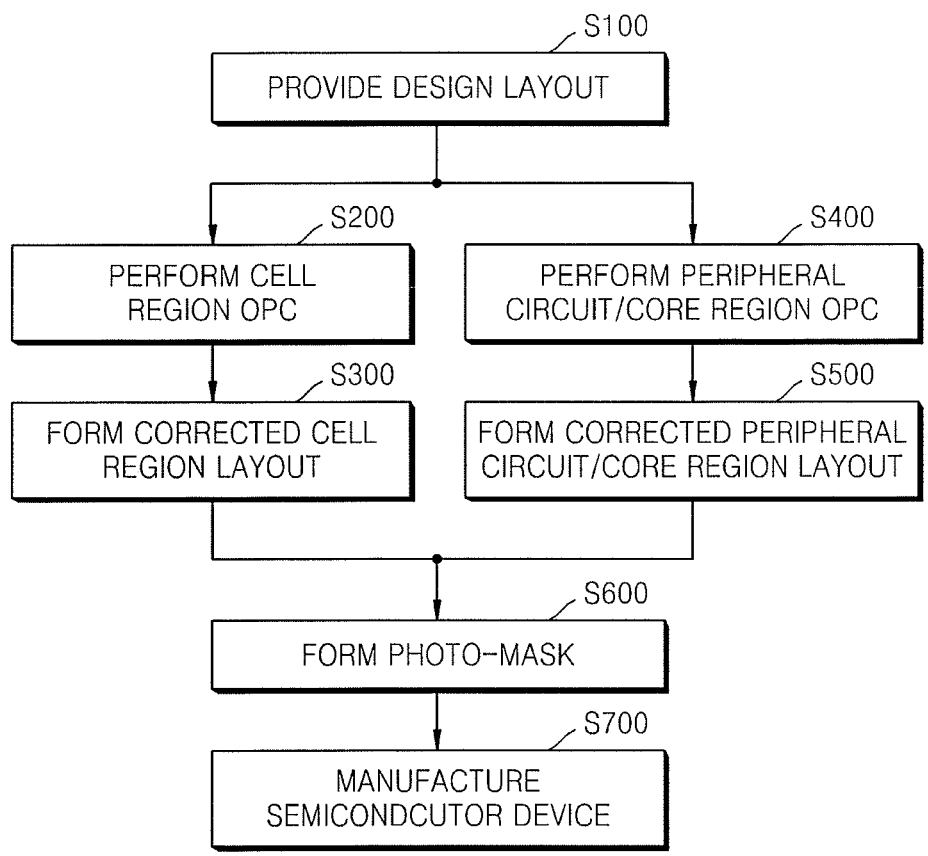
FIG. 10 illustrates a flowchart of a method of manufacturing a semiconductor device through a photo-mask formed according to an exemplary embodiment of the inventive concept.

FIG. 10 is a flowchart of a method of manufacturing a semiconductor device through a photo-mask formed according to an exemplary embodiment of the inventive concept.

Referring to FIG. 10, after a design layout is provided in operation S100, the design layout may be divided into a cell region and a peripheral circuit/core region to perform OPC on the cell region in operation S200 and on the peripheral circuit/core region in operation S400, thus forming a corrected cell region layout in operation S300 and a corrected peripheral circuit/core region layout in operation S500.

By using the corrected cell region layout and the corrected peripheral circuit/core region layout, a photo-mask may be formed in operation S600. The photo-mask may be manufactured by forming a mask pattern on a blank mask with the use of the cell region layout and the corrected peripheral circuit/core region layout. A semiconductor device may be manufactured using the formed photo-mask in operation S700.

Operation S200 of performing OPC on the cell region and operation S400 of performing OPC on the peripheral circuit/core region will be described in more detail below.

Operation S600 of forming the corrected cell region layout has already been described with reference to FIG. 8.

Figure 11A:
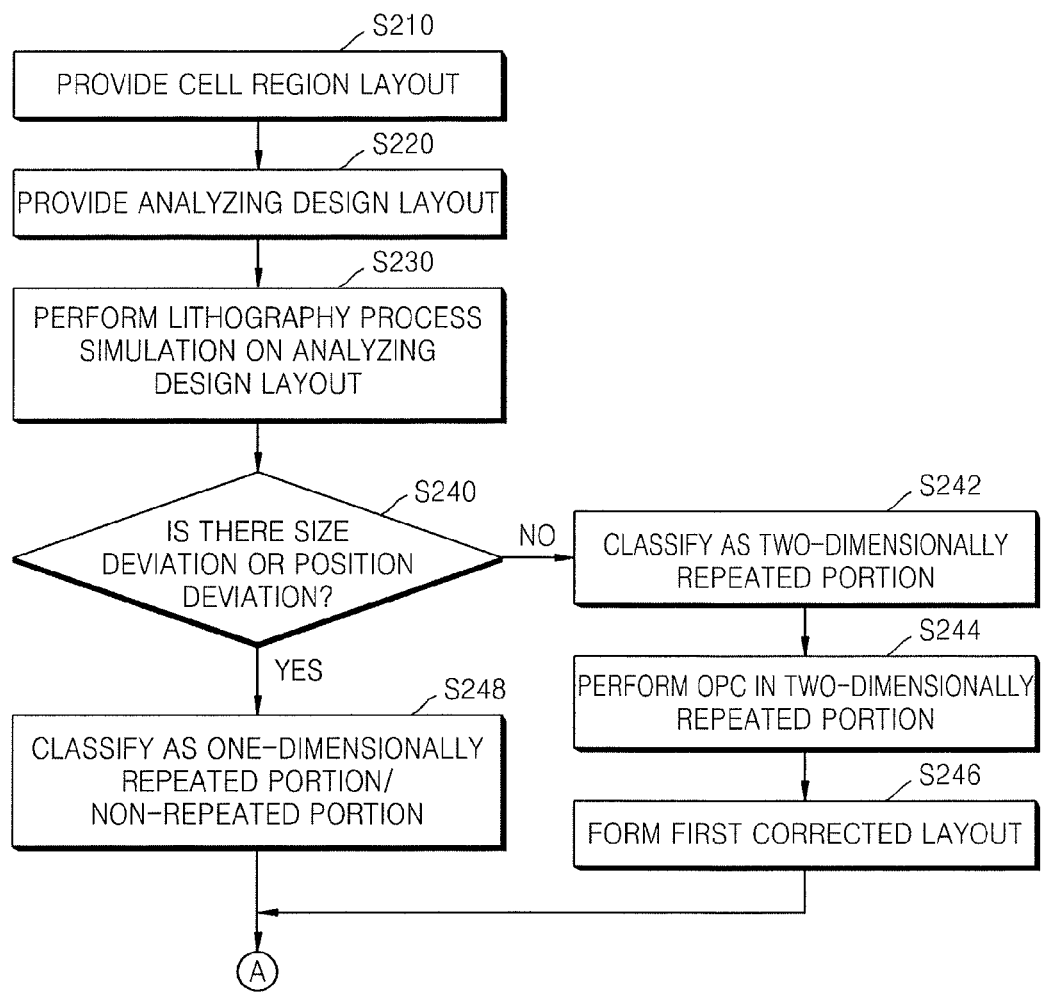
FIGS. 11A and 11B illustrate flowcharts of a first aspect of a method of performing OPC on a cell region to manufacture a photo-mask according to an exemplary embodiment of the inventive concept.
Figure 11B:
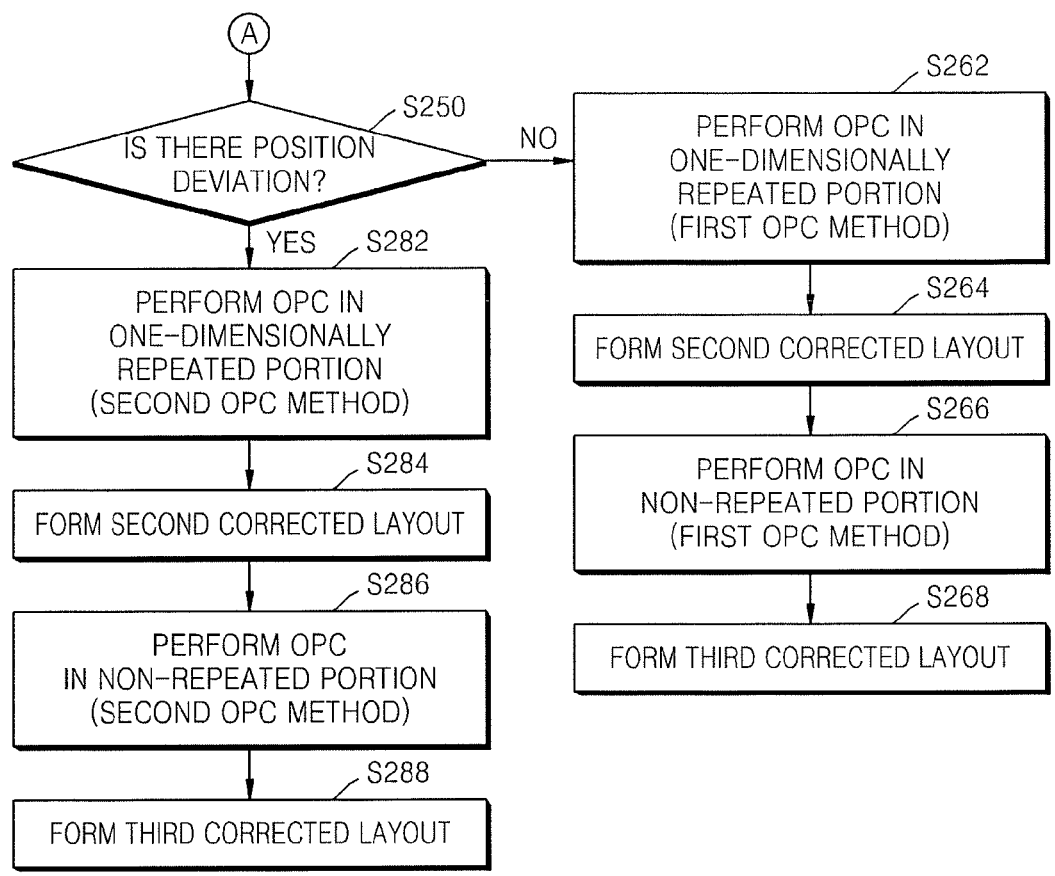

FIGS. 11A and 11B are flowcharts of a first aspect of a method of performing OPC on a cell region to manufacture a photo-mask according to an exemplary embodiment of the inventive concept. FIGS. 11A and 11B are detailed flowcharts of operation S200 according to an example embodiment.

Referring to FIG. 11A, the cell region layout of the design layout may be provided in operation S210, and an analyzing design layout may be provided from the cell region layout in operation S220. Operation S220 of providing the analyzing design layout has already been described with reference to FIGS. 6A and 6B. In operation S230, lithography process simulation may be performed on the analyzing design layout. A method of performing lithography process simulation has already been described with reference to FIGS. 1 through 3. In operation S240, a result of lithography process simulation may be analyzed to determine whether there is a size deviation or position deviation between patterns. Such a determination may be made according to whether the size deviation or position deviation is higher or lower than a predetermined allowable value.

A portion where neither size deviation nor position deviation exists is classified as a two-dimensionally repeated portion in operation S242, a portion where a size deviation and/or a position deviation exists is classified as a one-dimensionally repeated portion or a non-repeated portion in operation S248. The two-dimensionally repeated portion, the one-dimensionally repeated portion, and the non-repeated portion have already been described with reference to FIGS. 5A through 6B.

In operation S244, OPC may be performed on the two-dimensionally repeated portion. OPC with respect to the two-dimensionally repeated portion may use a first OPC method which uses symmetric size increase/reduction. As a result of OPC with respect to the two-dimensionally repeated portion, a first corrected layout may be formed in operation S246.

After operation S248 or operation S246, referring to FIG. 11B, it may be determined whether there is a position deviation between patterns in the one-dimensionally repeated portion and the non-repeated portion in operation S250. Such a determination may be made according to whether the position deviation exceeds or is less than a predetermined allowable value. If there is no position deviation in either the one-dimensionally repeated portion or the non-repeated portion, OPC may be performed on the one-dimensionally repeated portion by using the first OPC method in operation S262. For OPC with respect to the one-dimensionally repeated portion, the first corrected layout may be considered as a boundary condition. As a result of OPC with respect to the one-dimensionally repeated portion, a second corrected layout may be formed in operation S264.

In operation S266, operation may be performed on the non-repeated portion by using the first OPC method. For OPC with respect to the non-repeated portion, the first corrected layout and the second corrected layout may be considered as boundary conditions. As a result of OPC with respect to the non-repeated portion, a third corrected layout may be formed in operation S268. To form the third corrected layout, patterns of the non-repeated portion may be divided into a plurality of non-repeated division portions according to the degree of a size deviation and the degree of a position deviation and OPC may be performed thereon. In other words, when the sixth through ninth groups G6 through G9 shown in FIG. 5B form the non-repeated portion, the group G6, the group G7, the group G8, and the group G9 may be divided as the non-repeated division portions, and OPC may be performed in order of a group adjacent to the one-dimensionally repeated portion and the two-dimensionally repeated portion first, i.e., in order of the group G6, the groups G7/G8, and then the group G9. In this case, a result of OPC with respect to a group to which OPC is first applied may be used as a boundary condition for OPC with respect to another group to which OPC is applied next.

If there are position deviations in both the one-dimensionally repeated portion and the non-repeated portion, OPC may be performed first on the one-dimensionally repeated portion by using a second OPC method in operation S282. In this case, for OPC with respect to the one-dimensionally repeated portion, the first corrected layout may be used as a boundary condition. As a result of OPC with respect to the one-dimensionally repeated portion, a second corrected layout may be formed in operation S284.

The second OPC method may use symmetric/asymmetric size increase/reduction or/and position change. The first OPC method and the second OPC method may be those selected from OPC algorithms. The first OPC method may perform OPC by simply increasing or reducing a size in case of absence of a position deviation, and thus a processing speed thereof may be high. On the other hand, the second OPC method may use symmetric size increase/reduction or asymmetric size increase/reduction because a pattern to be formed may be asymmetrically distorted in case of existence of a position deviation. The second OPC method may also use position change. However, the second OPC method may have a lower processing speed than the first OPC method because of requiring various computations.

Therefore, by determining existence of a position deviation between patterns, the OPC method and the second OPC method are separately performed, thereby minimizing time required for OPC.

Afterwards, OPC may be performed on the non-repeated portion by using the second OPC method in operation S286. In this case, for OPC with respect to the non-repeated portion, the first corrected layout and the second corrected layout may be considered as boundary conditions. As a result of OPC with respect to the non-repeated portion, a third corrected layout may be formed in operation S288.

Figure 12:
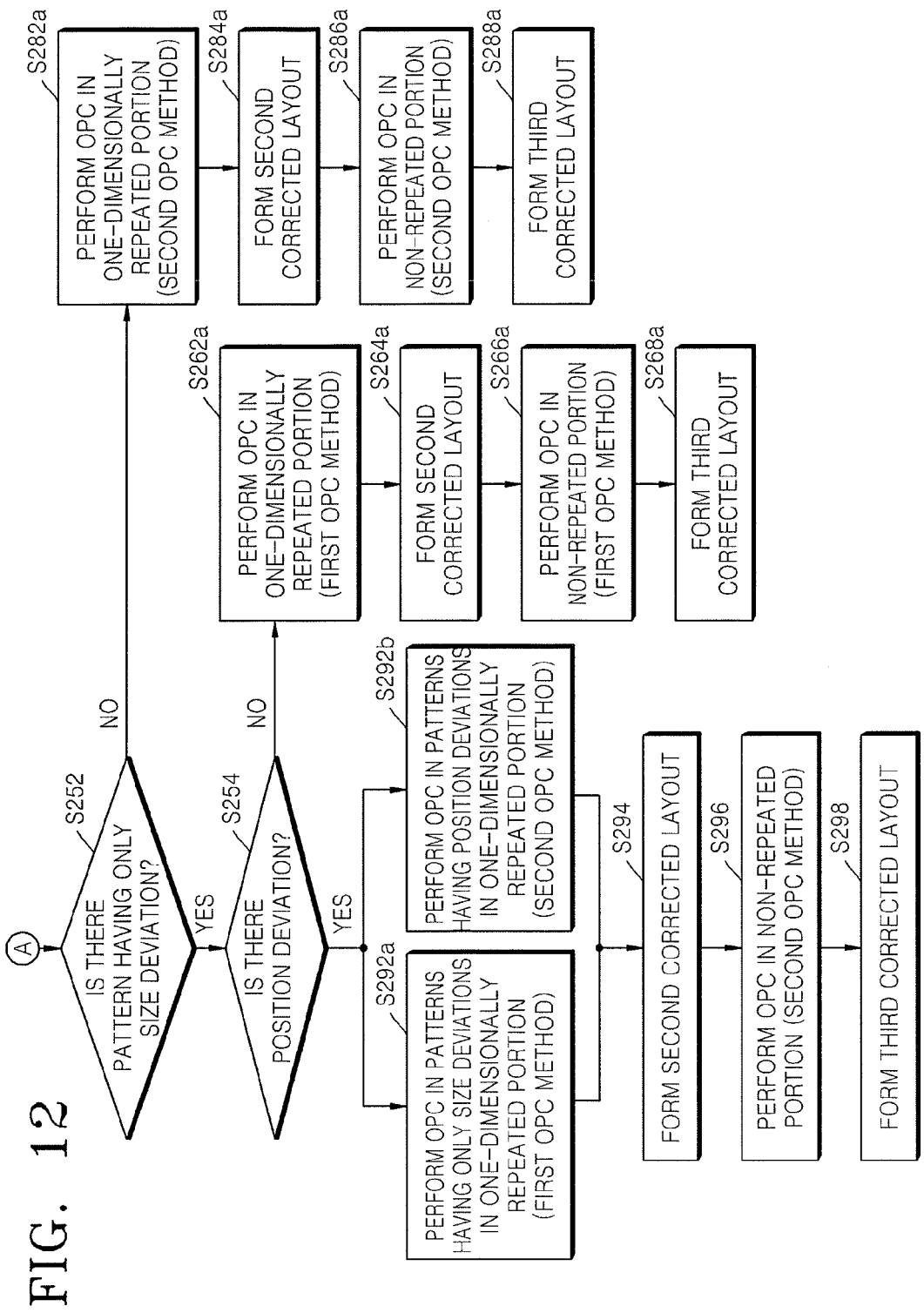
FIG. 12 illustrates a flowchart of a second aspect of a method of performing OPC on a cell region to manufacture a photo-mask according to an exemplary embodiment of the inventive concept.

FIG. 12 is a flowchart of a second aspect of a method of performing OPC on a cell region to manufacture a photo-mask according to an exemplary embodiment of the inventive concept. FIG. 11A and FIG. 12 are flowcharts illustrating in detail the second aspect of operation S200 of performing OPC on the cell region, which is shown in FIG. 10. Hereinafter, a description will be made with reference to FIG. 12 because a description has already been made with reference to FIG. 11A. Some description which has already been made with reference to FIG. 11B will not be provided.

Referring to FIG. 12, it may be determined whether there is a pattern having a size deviation in operation S252. If there is no pattern having only a size deviation, that is, every pattern has a position deviation, OPC is sequentially performed on the one-dimensionally repeated portion in operation S282a and on the non-repeated portion in operation S286a by using the second OPC method, thereby forming the second corrected layout in operation S284a and the third corrected layout in operation S288a. These operations are the same as operations S282, S284, S286, and S288 of FIG. 11B which are performed in case of existence of position deviations between patterns in the one-dimensionally repeated portion and the non-repeated portion, and thus will not be repetitively described.

If there is a pattern having only a size deviation, it is determined whether there is a position deviation between patterns in operation S254. If there is no pattern having a position deviation, every pattern has only a size deviation and thus OPC is sequentially performed on one-dimensionally repeated portion in operation S262a and on the non-repeated portion in operation S266a by using the first OPC method, thereby forming the second corrected layout in operation S264a and the third corrected layout in operation S268. These operations are the same as operations S262, S264, S266, and S268 of FIG. 11B which are performed in case of absence of a position deviation between patterns in the one-dimensionally repeated portion and the non-repeated portion, and thus will not be repetitively described.

If there is a pattern having only a size deviation and there is also a pattern having a position deviation, different OPC methods may be applied thereto. For example, in the one-dimensionally repeated pattern, OPC is performed on a pattern having only a size deviation by using the first OPC method in operation S292a, and OPC is performed on a pattern having a position deviation by using the second OPC method in operation S292b. Referring to FIG. 7, in the one-dimensionally repeated portion R-1P, if the x-direction repeated portion R-1Px has only size deviations and the y-direction repeated portion R-1Py has position deviations, or vice versa, OPC may be performed in the foregoing manner. In this case, since OPC is performed on some of the one-dimensionally repeated portion by using the first OPC method which has a high processing speed, time required for OPC may be shortened.

Thereafter, the second corrected layout is formed by OPC with respect to the one-dimensionally repeated portion in operation S294. If there is a pattern having a position deviation in the one-dimensionally repeated portion, a position deviation may be generated in at least a direction in the non-repeated portion. Thus, OPC is performed on the non-repeated portion by using the second OPC method in operation S296, thereby forming the third corrected layout in operation S298.

Figure 13:
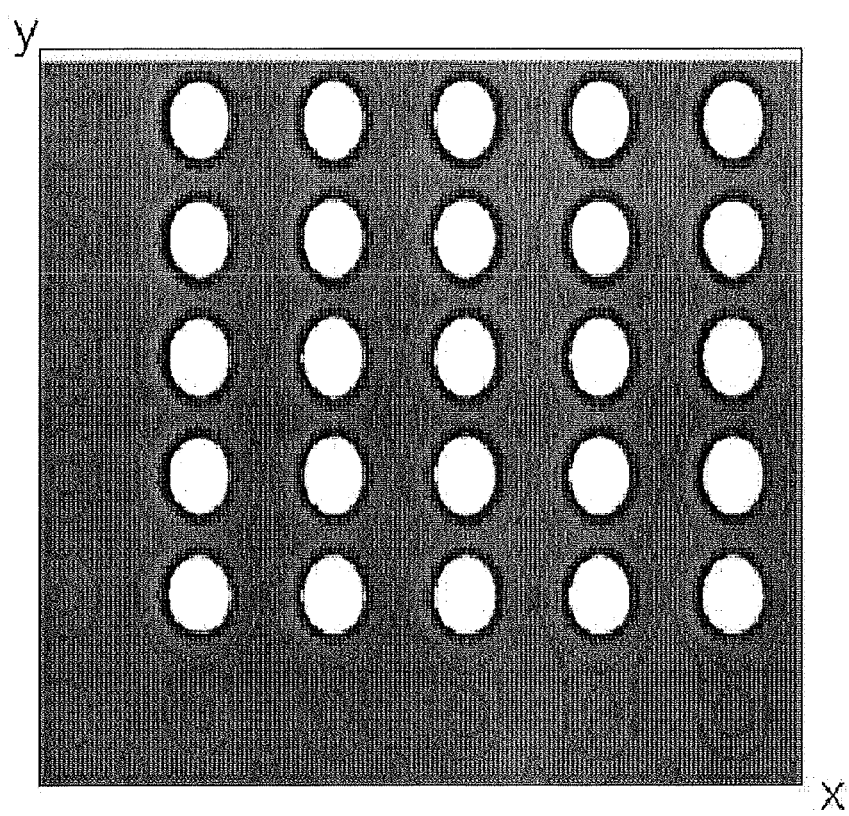
FIG. 13 illustrates a picture image of a resist pattern of a cell region formed using a photo-mask formed according to an exemplary embodiment of the inventive concept.

FIG. 13 is a photograph of a resist pattern of a cell region formed using a photo-mask formed according to an exemplary embodiment of the inventive concept. The photo-mask in FIG. 13 is for forming holes.

Referring to FIG. 13, it can be seen that almost similar patterns may be formed in an edge portion of a cell region, especially corner portions of the cell region, and inside the cell region. Therefore, a method of manufacturing a photo-mask according to an embodiment of the inventive concept may quickly and accurately perform OPC, thereby reducing time required for manufacturing the photo-mask.

Figure 14:
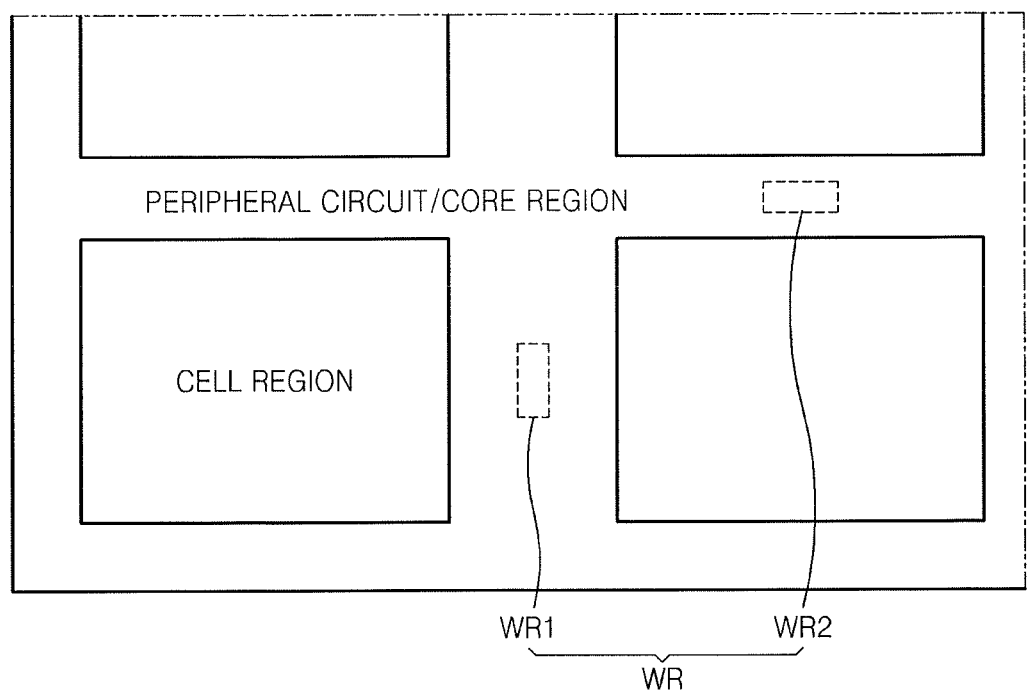
FIG. 14 illustrates a conceptual diagram for describing a method of performing OPC on a peripheral circuit/core region to manufacture a photo-mask according to an exemplary embodiment of the inventive concept.

FIG. 14 is a conceptual diagram of a method of performing OPC on a peripheral circuit/core region to manufacture a photo-mask according to an exemplary embodiment of the inventive concept.

Referring to FIG. 14, a weak region WR may be set by performing a pattern weakness check, i.e., test, with respect to a peripheral circuit/core region in a design layout. Thus, the peripheral circuit/core region may be divided into sub regions of the weak region WR and a non-weak region (region other than the weak region). The weak region WR may include a plurality of weak regions, e.g., weak regions WR1 and WR2, as shown in FIG. 14, but only a single region may be set as the weak region WR. The plurality of weak regions WR1 and WR2 may have different degrees of weakness, e.g., a weaker region and a less weak region. The pattern weakness check has already been described with reference to FIGS. 1 through 3.

Figure 15:
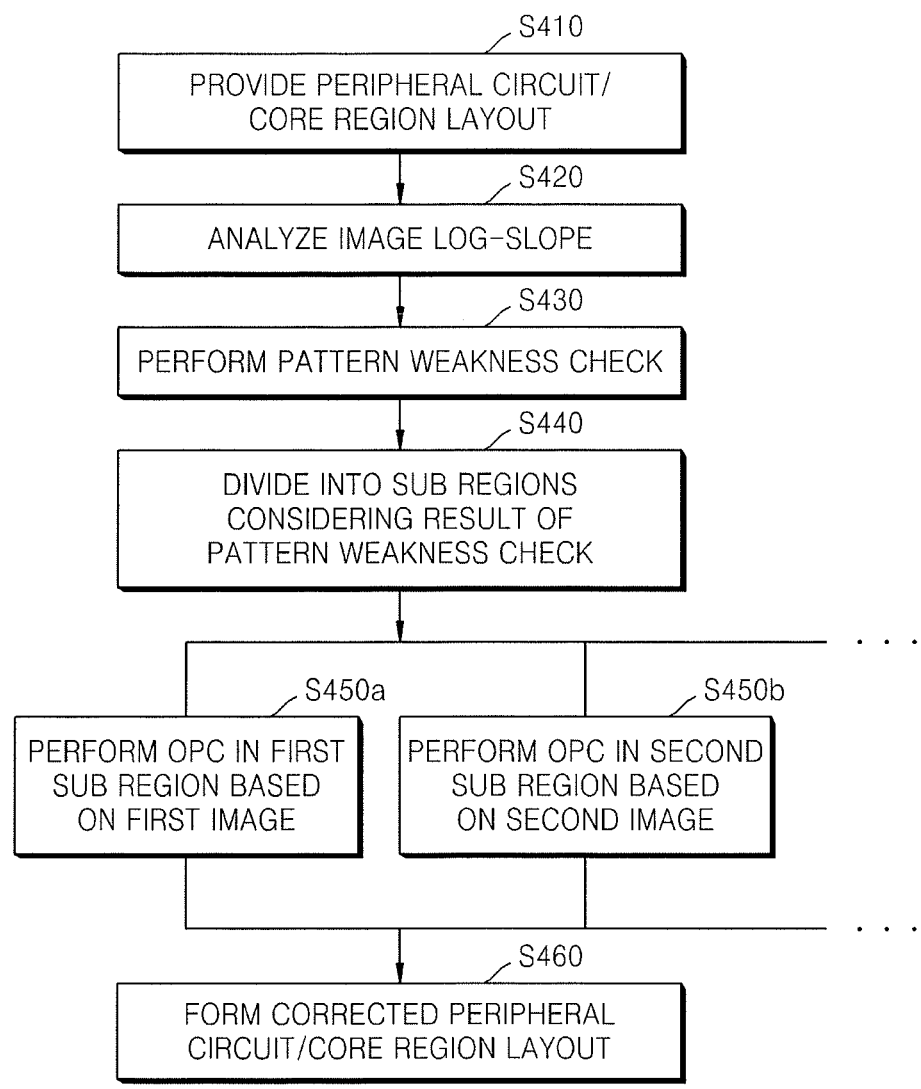
FIG. 15 illustrates a flowchart of a method of performing OPC on a peripheral circuit/core region to manufacture a photo-mask according to an exemplary embodiment of the inventive concept.

FIG. 15 is a flowchart of a method of performing OPC on a peripheral circuit/core region to manufacture a photo-mask according to an exemplary embodiment of the inventive concept. FIG. 15 is a detailed flowchart of operation S400 of performing OPC with respect to the peripheral circuit/core region shown in FIG. 10.

Referring to FIG. 15, the peripheral circuit/core region layout of the design layout may be provided in operation S410, and an ILS may be analyzed with respect to the peripheral circuit/core region layout in operation S420. A pattern weakness check may be performed using a result of the analysis of the ILS in operation S430. Thereafter, considering the result of the pattern weakness check, the peripheral circuit/core region layout may be divided into a plurality of sub regions in operation S440. The sub regions may be divided according to a level of pattern weakness.

Afterwards, OPC may be performed on different sub regions based on different images in operations S450a and S450b. In other words, if there are a first sub region and a second sub region divided according to a level of pattern weakness, OPC may be performed thereon based on a first image and a second image, respectively. Herein, the first image and the second image may be different images selected from the aerial image, the image in resist, the exposed latent image in resist, the PEB image, and the developed resist image.

For example, if the first sub region has a higher level of pattern weakness and the second sub region has a lower level of pattern weakness, lithography process simulation may be performed on the second sub region to obtain the aerial image, and then, OPC may be performed based on the aerial image. For the first sub region, lithography process simulation for forming any one of the image in resist, the exposed latent image in resist, the PEB image, and the developed resist image may be performed, and then, OPC may be performed based on the formed image.

After OPC is performed separately for the plurality of sub regions, the corrected peripheral circuit/core region layout may be formed based on a result of OPC in operation S460.

In this way, a level, i.e., degree, of pattern weakness may be considered in accordance with time required for lithography simulation. That is, for a less weak portion, OPC may be performed based on an image which needs less time for lithography process simulation, and for a weaker portion, OPC may be performed based on an image which needs more time for lithography process simulation, thereby minimizing the entire time required for OPC.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of manufacturing a photo-mask, the method comprising:
   providing an analyzing design layout;
   dividing the analyzing design layout into a two-dimensionally repeated portion, a one-dimensionally repeated portion, and a non-repeated portion;
   forming a first corrected layout by performing optical proximity correction (OPC) in the two-dimensionally repeated portion;
   forming a second corrected layout by performing OPC in the one-dimensionally repeated portion, while taking into account the first corrected layout;
   forming a third corrected layout by performing OPC in the non-repeated portion, while taking into account the first corrected layout and the second corrected layout; and
   forming a photo-mask based on the first through third corrected layouts.

2. The method as claimed in claim 1, wherein dividing the analyzing design layout includes:
   performing lithography process simulation with respect to the analyzing design layout to obtain a simulation result; and
   analyzing sizes and positions of patterns in the simulation result.

3. The method as claimed in claim 2, wherein dividing the analyzing design layout includes:
   forming the two-dimensionally repeated portion to include patterns which have size deviations and position deviations of less than predetermined allowable values along two directions perpendicular to each other among the patterns included in the simulation result;
   forming the one-dimensionally repeated portion to include patterns which have size deviations and position deviations of less than predetermined allowable values along one of the two perpendicular directions among the patterns included in the simulation result; and
   forming the non-repeated portion to include the remaining patterns of the simulation result except for the two-dimensionally repeated portion and the one-dimensionally repeated portion.

4. The method as claimed in claim 3, wherein forming the second corrected layout includes performing OPC on the one-dimensionally repeated portion separately along repeated directions.

5. The method as claimed in claim 3, wherein forming the third corrected layout includes performing OPC on the non-repeated portion by dividing the non-repeated portion into a plurality of non-repeated division portions according to a degree of a size deviation and a degree of a position deviation.

6. The method as claimed in claim 3, wherein forming the first through third corrected layouts includes performing OPC by using a first OPC method via symmetric size increase/reduction or by using a second OPC method via symmetric/asymmetric size increase/reduction or/and position change, forming of the first corrected layout including performing OPC by using the first OPC method.

7. The method as claimed in claim 6, wherein, if patterns of the one-dimensionally repeated portion and the non-repeated portion have only size deviations, forming the second corrected layout and the third corrected layout includes performing OPC by using the first OPC method.

8. The method as claimed in claim 6, wherein, if there are patterns having position deviations in the one-dimensionally repeated portion and the non-repeated portion, forming the second corrected layout and the third corrected layout includes performing OPC by using the second OPC method.

9. The method as claimed in claim 6, wherein:
if there are patterns having only size deviations and patterns having position deviations in the one-dimensionally repeated portion, forming the second corrected layout includes performing OPC on the patterns having only size deviations among the patterns of the one-dimensionally repeated portion by using the first OPC method and performing OPC on the patterns having position deviations among the patterns of the one-dimensionally repeated portion by using the second OPC method; and
forming of the third corrected layout includes performing OPC by using the second OPC method.

10. The method as claimed in claim 1, wherein providing the analyzing design layout includes:
providing a layout of a cell region;
selecting a partial cell region in a rectangular shape from a corner of the cell region in the layout of the cell region; and
forming the analyzing design layout in a rectangular shape having four corners by combining the partial cell region and a result of reversing or rotating the partial cell region.

11. The method as claimed in claim 10, wherein forming the photo-mask includes:
forming a corrected cell region layout; and
forming a mask pattern on a blank mask by using the corrected cell region layout,
wherein forming the corrected cell region layout includes:
forming a cell corner portion layout by disposing the third corrected layout in corner regions of the cell region,
forming a cell edge portion layout by repetitively disposing the second corrected layout in an edge region between two adjacent corner regions of the cell region, and
forming a cell central portion layout by repetitively disposing the first corrected layout in a central region except for the corner regions and the edge region of the cell region.

12. The method as claimed in claim 1, wherein forming the second corrected layout includes performing OPC by considering the first corrected layout as a boundary condition for the second corrected layout.

13. The method as claimed in claim 1, wherein forming the third corrected layout includes performing OPC by considering the first corrected layout and the second corrected layout as boundary conditions for the third corrected layout.

14. A method of manufacturing a photo-mask, the method comprising:
providing a design layout comprising a cell region and a peripheral circuit/core region;
performing cell region optical proximity correction (OPC) on the cell region in the design layout;
performing peripheral circuit/core region OPC on the peripheral circuit/core region in the design layout; and
forming a photo-mask based on a result of the cell region OPC and a result of the peripheral circuit/core region OPC,
wherein performing OPC on the cell region OPC includes:
forming an analyzing design layout based on the cell region of the design layout,
dividing the analyzing design layout into a two-dimensionally repeated portion, a one-dimensionally repeated portion, and a non-repeated portion,
forming a first corrected layout by performing OPC in the two-dimensionally repeated portion,
forming a second corrected layout, taking into account the first corrected layout as a boundary condition, by performing OPC in the one-dimensionally repeated portion, and
forming a third corrected layout, taking into account the first corrected layout and the second corrected layout as boundary conditions, by performing OPC in the non-repeated portion; and
wherein forming the peripheral circuit/core region OPC includes:
performing pattern weakness check with respect to the peripheral circuit/core region, and
separately performing OPC by dividing the peripheral circuit/core region into sub regions, considering a result of the pattern weakness check.

15. The method as claimed in claim 14, wherein performing the pattern weakness check includes:
analyzing an image log-slope (ILS) with respect to the peripheral circuit/core region of the design layout; and
analyzing the pattern weakness based on a result of the ILS.

16. A method of manufacturing a photo-mask, the method comprising:
providing an analyzing design layout;
dividing the analyzing design layout into a two-dimensionally repeated portion, a one-dimensionally repeated portion, and a non-repeated portion;
forming a first corrected layout by performing optical proximity correction (OPC) in the two-dimensionally repeated portion;
forming a second corrected layout by performing OPC in the one-dimensionally repeated portion, such that the first corrected layout defines a boundary between the two-dimensionally repeated portion and the one-dimensionally repeated portion;
forming a third corrected layout by performing OPC in the non-repeated portion, such that the first corrected layout defines a boundary between the two-dimensionally repeated portion and the one-dimensionally repeated portion and the second corrected layout defines a boundary between the one-dimensionally repeated portion and the non-repeated portion; and
forming a photo-mask based on the first through third corrected layouts.

17. The method as claimed in claim 16, wherein dividing the analyzing design layout includes forming the two-dimensionally repeated portion in a center of the layout, forming the one-dimensionally repeated portion along edges of the layout, and forming the non-repeated portion in corners of the layout.

18. The method as claimed in claim 16, wherein dividing the analyzing design layout includes:
forming the two-dimensionally repeated portion to include patterns along two directions perpendicular to each other;

forming the one-dimensionally repeated portion to include patterns along one of the two perpendicular directions; and forming the non-repeated portion to include patterns other than patterns of the two-dimensionally repeated portion and the one-dimensionally repeated portion.

19. The method as claimed in claim 18, wherein forming the third corrected layout includes performing OPC on the non-repeated portion by dividing the non-repeated portion into a plurality of non-repeated division portions according to a degree of a size deviation and a degree of a position deviation.

20. The method as claimed in claim 18, wherein forming the first through third corrected layouts includes performing OPC by using a first OPC method via symmetric size increase/reduction or by using a second OPC method via symmetric/asymmetric size increase/reduction or/and position change, forming of the first corrected layout including performing OPC by using the first OPC method.

* * * * *